(12) United States Patent
Koyama et al.

(10) Patent No.: US 8,075,800 B2
(45) Date of Patent: Dec. 13, 2011

(54) POLISHING SLURRY AND POLISHING METHOD

(75) Inventors: Naoyuki Koyama, Hitachi (JP); Youichi Machii, Tsuchiura (JP); Masato Yoshida, Tsukuba (JP); Masato Fukasawa, Hitachi (JP); Toranosuke Ashizawa, Hitachinaka (JP)

(73) Assignee: Hitachi Chemical Co., Ltd., Tokyo (JP)

(*) Notice: Subject to any disclaimer, the term of this patent is extended or adjusted under 35 U.S.C. 154(b) by 646 days.

(21) Appl. No.: 10/558,406

(22) PCT Filed: May 28, 2004

(86) PCT No.: PCT/JP2004/007746
§ 371 (c)(1),
(2), (4) Date: Nov. 28, 2005

(87) PCT Pub. No.: WO2004/107429
PCT Pub. Date: Dec. 9, 2004

(65) Prior Publication Data
US 2006/0289826 A1 Dec. 28, 2006

(30) Foreign Application Priority Data
May 28, 2003 (JP) ................. P2003-150319

(51) Int. Cl.
*C09K 13/00* (2006.01)
*H01L 21/461* (2006.01)
*H01L 21/302* (2006.01)

(52) U.S. Cl. .......... 252/79.1; 252/79.2; 252/79.3; 252/79.4; 438/692; 216/88

(58) Field of Classification Search .......... 252/79.1, 252/79.2, 79.3, 79.4, 79.5; 438/689, 690, 438/692; 216/88
See application file for complete search history.

(56) References Cited

U.S. PATENT DOCUMENTS

| | | | | |
|---|---|---|---|---|
| 3,123,452 A * | 3/1964 | Harris | ........ | 51/307 |
| 6,143,643 A * | 11/2000 | Carter et al. | ........ | 438/622 |
| 6,190,443 B1 * | 2/2001 | Ohashi et al. | ........ | 106/3 |
| 6,372,003 B1 * | 4/2002 | Kasai et al. | ........ | 51/309 |
| 6,689,692 B1 * | 2/2004 | Grover et al. | ........ | 438/691 |
| 2003/0124959 A1 * | 7/2003 | Schroeder et al. | ........ | 451/41 |

FOREIGN PATENT DOCUMENTS

| | | | |
|---|---|---|---|
| JP | 8-22970 | | 1/1996 |
| JP | 10-106994 | | 4/1998 |
| JP | 2001-57351 | | 2/2001 |
| JP | 2001064688 | * | 3/2001 |
| JP | 2001-107089 | | 4/2001 |
| JP | 2002-241739 | | 8/2002 |

OTHER PUBLICATIONS

S. Wolf, (Silicon Processing for the VLSI Era, vol. 4—Deep Submicron Process Technology, Lattice Press, 2002, pp. 352).*
Forms PCT/IB/338 and PCT/IPEA/409 of International Application PCT/JP2004/007746 mailed Dec. 1, 2005.
Ginya Adachi, Kidorui no Kagaku (Scien of Rare Earths), Kagaku-Dojin Publishing Company, pp. 304-305.

* cited by examiner

*Primary Examiner* — Nadine G Norton
*Assistant Examiner* — Mahmoud Dahimene
(74) *Attorney, Agent, or Firm* — Westerman, Hattori, Daniels & Adrian, LLP (57) ABSTRACT

A polishing slurry containing a slurry dispersing particles of tetravalent metal hydroxide in a medium therein and an additive, characterized in that the additive is a polymer containing at least one kind of monomer component selected from a group of monomers represented with a general formulae (I) and (II) below (In the general formulae (I) and (II), $R_1$ denotes hydrogen, a methyl group, a phenyl group, a benzil group, a chlorine group, a difluoromethyl group, a trifluoromethyl group or a cyano group, $R_2$ and $R_3$ denote hydrogen or an alkyl chain having 1 to 18 carbon atoms, a methylol group, an acetyl group or a diacetonyl group, and a case where both are hydrogen is not included. $R_4$ denotes a morpholino group, a thiomorpholino group, a pyrrolidinyl group or a piperidino group.) The invention provides a polishing slurry in which particles form a chemical reaction layer with a polishing film to be removed with a very small mechanical action of the particles and mechanical removal by a pad without scratches and the additive realizes high planarity.

(I)

-continued (II)

15 Claims, 3 Drawing Sheets

POLISHING SLURRY AND POLISHING METHOD

TECHNICAL FIELD

The present invention relates to a polishing slurry for use in chemical mechanical polishing that used in semiconductor device manufacturing technology in a process of planarizing a surface of a substrate, in particular, in a process of planarizing an interlayer insulating film and in a process of forming a shallow trench isolation; and a polishing method using the polishing slurry.

BACKGROUND ART

In a present manufacturing process of ULSI semiconductor devices, processing technologies for obtaining higher density and greater degrees of miniaturization are under study. A chemical mechanical polishing technology (hereinafter, referred to as CMP), one of the processing technologies under study, is an indispensable technology when, in a manufacturing process of semiconductor devices, for instance an interlayer insulating film is planarized, a shallow trench isolation is formed, and a plug and an embedding metal wiring are formed.

So far, in a manufacturing process of semiconductor devices, as a chemical mechanical polishing slurry for planarizing an inorganic insulating film such as a silicon oxide insulating film formed according to a method such as a plasma-CVD or a low-pressure CVD, a polishing slurry based on fumed silica is generally studied. The fumed-silica base polishing slurry is manufactured by grain growing according to pyrolysis of silicon tetrachloride followed by controlling the pH. However, such a polishing slurry has a technical disadvantage in that the polishing speed is low.

Furthermore, in generations after a design rule of 0.25 µm, the shallow trench isolation is used to isolate elements in an integrated circuit. In the shallow trench isolation, in order to remove a silicon oxide film deposited in excess on a substrate, a CMP process is used. In order to stop the polishing, a stopper film low in the polishing speed is formed under the silicon oxide film. As the stopper film, a film such as silicon nitride film is used. The larger a ratio of the polishing speeds of the silicon oxide film to the stopper film, the more desirable. Since in an existing colloidal silica base polishing slurry the ratio of the polishing speeds of the silicon oxide film to the stopper film is such small as substantially 3, the polishing slurry does not have the characteristics practically usable in the shallow trench isolation.

On the other hand, as a polishing slurry of glass surfaces of such as photomasks and lenses, a cerium oxide polishing slurry is used. Cerium oxide particles are low in hardness in comparison with that of silica particles and alumina particles; as a result, a polishing surface is difficult to be scratched. Accordingly, it is useful for finish mirror polishing. Furthermore, it is advantageous in that the polishing speed is higher than that of the silica polishing slurry. Recently, a polishing slurry for use in the semiconductor CMP, which uses high purity cerium abrasive grains, is in use. The technology is disclosed in for instance Japanese Patent Application Laid-Open No. 10-106994.

Furthermore, it is known to add an additive to control the polishing speed of a cerium oxide polishing liquid and to improve global planarity. The technology is disclosed in for instance Japanese Patent Application Laid-Open No. 08-22970.

It is said that when a cerium oxide polishing slurry is applied to polish a semiconductor insulating film, a process is forwarded owing to a chemical action of cerium oxide and a mechanical removal action due to particles. However, the mechanical removal action due to particles causes polishing scratches. In this connection, a primary particle diameter of cerium oxide is selected so as to give a desirable polishing speed and a surface state such as polishing scratches; however, as far as the cerium oxide particles are used, a polished film surface free from the polishing scratches cannot be obtained. From now on, as a semiconductor device is advanced toward more multi-layered and higher definition, in order to improve a yield of semiconductor devices, a polishing slurry that is free from the polishing scratches and capable of polishing at a higher speed is indispensable. Still further, in order to realize the shallow trench isolation, a polishing slurry in which a ratio of the polishing speed of a silicon oxide insulating film to that of a silicon nitride insulating film is for instance 10 or more is necessary.

DISCLOSURE OF THE INVENTION

In order to eliminate the polishing scratches due to particles, it is necessary to take advantage of the chemical activity of particles and to make the mechanical action as small as possible. The invention intends to provide a polishing slurry in which particles form a chemical reaction layer with a film to be polished, and the chemical reaction layer is removed owing to a very small mechanical action of the particles and mechanical removal of a polishing pad to realize high-speed polishing without causing the polishing scratches; and a polishing method.

Furthermore, the invention intends to provide a polishing slurry in which when an additive is added a ratio of a polishing speed of a silicon oxide insulating film to that of a silicon nitride insulating film becomes 10 or more to be preferable for the shallow trench isolation; and a polishing method.

The invention relates to (1) through (12) below.

(1) A polishing slurry containing a slurry in which particles of tetravalent metal hydroxide are dispersed in a medium and an additive, the additive being a polymer containing at least one kind of monomer component selected from a group of monomers shown with a general formula (I) below (In the general formula (I), $R_1$ denotes hydrogen, a methyl group, a phenyl group, a benzil group, a chlorine group, a difluoromethyl group, a trifluoromethyl group or a cyano group, $R_2$ and $R_3$, respectively, independently denote hydrogen or an alkyl chain having 1 to 18 carbon atoms, a methylol group, an acetyl group or a diacetonyl group, and a case where both are hydrogen is not included) and a general formula (II) below (In the general formula (II), $R_1$ is common with the formula (I) and $R_4$ denotes a morpholino group, a thiomorpholino group, a pyrrolidinyl group or a piperidino group).

(2) The polishing slurry according to the (1), wherein a specific surface area of the particles of tetravalent metal hydroxide is not less than 100 $m^2/g$.

(3) The polishing slurry according to the (1) or (2), wherein a median value of particle diameters of secondary particles of tetravalent metal hydroxide dispersed in a medium is not more than 300 nm.

(4) The polishing slurry according to any one of the (1) through (3), wherein the pH of the polishing slurry is 3 through 9.

(5) The polishing slurry according to any one of the (1) through (4), wherein the polymer has at least one of a skeleton of an N-mono-substitution product of acrylamide, a skeleton of an N-mono-substitution product of methacrylamide, a skeleton of an N,N-disubstitution product of acrylamide and a skeleton of an N,N-disubstitution product of methacrylamide.

(6) The polishing slurry according to any one of the (1) through (5), wherein the polymer is poly (N,N-dimethyl acrylamide).

(7) The polishing slurry according to any one of the (1) through (6), wherein the tetravalent metal hydroxide is at least one of a rare earth metal hydroxide and a zirconium hydroxide.

(8) The polishing slurry according to any one of the (1) through (7), wherein a tetravalent metal salt and an alkaline liquid are blended to obtain the tetravalent metal hydroxide.

(9) The polishing slurry according to any one of the (1) through (8), wherein the medium is water.

(10) A polishing method where a predetermined substrate is polished with the polishing slurry according to any one of the (1) through (9).

(11) A polishing method where, a surface to be polished of a substrate on which at least a silicon oxide film is formed is pressed against a polishing pad to apply pressure, and, with the polishing slurry described in any one of the (1) through (9) supplying between the polishing pad and the surface to be polished, the surface to be polished and the polishing pad are relatively moved to each other to polish.

(12) The polishing method according to the (10) or (11), wherein the substrate is a substrate in the process of manufacturing a semiconductor device.

BRIEF DESCRIPTION OF THE DRAWINGS

FIGS. 1A through 1C are schematic diagrams of an evaluation portion of a CMP test wafer for use in a shallow trench isolation (STI) insulating film in an example according to the invention, wherein

DESCRIPTION OF REFERENCE NUMERALS

1 silicon substrate
2 silicon nitride (SiN) film
3 trench
4 insulating film ($SiO_2$)

BEST MODE FOR CARRYING OUT THE INVENTION

A polishing slurry according to the invention is one that includes a slurry in which particles of tetravalent metal hydroxide are dispersed in a medium and an additive. The specific surface area of the particles of tetravalent metal hydroxide is preferably 100 $m^2/g$ or more. The median value of secondary particles of the particles is preferably 300 nm or less. As the tetravalent metal hydroxide, at least one of rare earth metal hydroxides and zirconium hydroxide is used. As a medium, water can be used. The metal hydroxide can be obtained for instance when a tetravalent metal salt and an alkali are blended. By use of the polishing slurry according to the invention, a predetermined substrate such as a semiconductor substrate on which for instance a silica film is formed can be polished.

In the invention, as a method of preparing a metal hydroxide, a method of blending a tetravalent metal salt and an alkaline solution can be used. The method is described in for instance Kidorui no Kagaku (Science of Rare Earths) (Edited by Ginya Adachi, published by Kagaku-Dojin Publishing Company, 1999) p. 304 to 305. As the tetravalent metal salts, for instance, $M(SO_4)_2$, $M(NH_4)_2(NO_3)_6$, $M(NH_4)_4(SO_4)_4$ (Here, M denotes a rare earth element), and $Zr(SO_4)_2 \cdot 4H_2O$ are preferable. In particular, Ce that is chemically active is more preferable. As the alkali solution, aqueous ammonia, potassium hydroxide, and sodium hydroxide can be used. Aqueous ammonia can be more preferably used.

Powdery tetravalent metal hydroxide synthesized according to the above method can be washed to remove metal impurities. In the washing of the metal hydroxide, a method where the solid-liquid separation is repeated several times with a centrifugal separator can be applied.

As the tetravalent metal hydroxides, at least one of rare earth metal hydroxides and zirconium hydroxide is preferably used. At least two kinds may be selected from the rare earth metal hydroxides and zirconium hydroxide to use. As the rare earth metal hydroxide, cerium hydroxide is more preferable.

The particles of tetravalent metal hydroxide obtained by washing according to the above are dispersed in a liquid medium, and thereby a slurry can be prepared.

As a method of dispersing the particles of metal hydroxide in a medium, in addition to a dispersion process with an ordinary agitator, a homogenizer, an ultra-sonic disperser or a ball mill can be used.

When an additive is added to the slurry, a polishing slurry according to the invention can be obtained. There is no particular restriction on a method of adding the additive. The additive may be added to a medium before dispersion, may be added simultaneously with the dispersion process, or may be added after the dispersion.

The additive in the invention is a polymer containing at least one kind of monomer component selected from groups represented by general formulas (I) and (II) below.

(I)

In the general formula (I), $R_1$ denotes hydrogen, a methyl group, a phenyl group, a benzil group, a chlorine group, a difluoromethyl group, a trifluoromethyl group or a cyano group, and $R_2$ and $R_3$, respectively, independently denote hydrogen or an alkyl chain having 1 to 18 carbon atoms, a methylol group, an acetyl group or a diacetonyl group but a case where both are hydrogen is not included.

(II)

In the general formula (II), $R_1$ is common with that of the general formula (I) and $R_4$ denotes a morpholino group, a thiomorpholino group, a pyrrolidinyl group or a piperidino group.

The additive preferably is soluble in water, and preferably is a high polymer compound.

The polymer may be a copolymer containing a monomer component other than the monomers represented by the general formulas (I) and (II). Such monomer components include vinyl alcohol, vinyl acetate, acrylic acid, methacrylic acid, acrylic ester, methacrylic ester, acrylonitrile, maleic acid, itaconic acid, vinylamine, vinylpyridine, allylamine, vinylpyrrolidone, vinylcaprolactam, vinyl methyl ether, vinyl methyl oxazolidinone, vinyl formal, vinyl acetal, vinyl amine, vinyl isobutyl ether, acrylamide and methacrylamide. These can be used singularly or in combination of two or more kinds.

The polymer to be used as the additive can be obtained from at least a monomer represented by the general formulas (I) and (II) according to a generally known polymerizing method such as a radical polymerization. As the monomer represented by the general formulas (I) and (II) in the invention, compounds below can be cited:

N-methyl acrylamide, N-ethyl acrylamide, N-propyl acrylamide, N-isopropyl acrylamide, N-butyl acrylamide, N-isobutyl acrylamide, N-tert-butyl acrylamide, N-heptyl acrylamide, N-octyl acrylamide, N-tert-octyl acrylamide, N-dodecyl acrylamide, N-octadecyl acrylamide, N-methylol acrylamide, N-acetyl acrylamide, N-diacetone acrylamide, N-methyl methacrylamide, N-ethyl methacrylamide, N-propyl methacrylamide, N-isopropyl methacrylamide, N-butyl methacrylamide, N-isobutyl methacrylamide, N-tert-butyl methacrylamide, N-heptylmethacrylamide, N-octyl-methacrylamide, N-tert-octyl methacrylamide, N-dodecyl methacrylamide, N-octadecyl methacrylamide, N-methylol methacrylamide, N-acetyl methacrylamide, N-diacetone methacrylamide, N,N-dimethyl acrylamide, N,N-diethyl acrylamide, N,N-dipropyl acrylamide, N,N-diisopropyl acrylamide, N,N-dibutyl acrylamide, N,N-diisobutyl acrylamide, N,N-di-tert-butyl acrylamide, N,N-diheptyl acrylamide, N,N-dioctyl acrylamide, N,N-di-tert-octyl acrylamide, N,N-didodecyl acrylamide, N,N-dioctadecyl acrylamide, N,N-dimethylol acrylamide, N,N-diacetyl acrylamide, N,N-didiacetone acrylamide, N,N-dimethyl methacrylamide, N,N-diethyl methacrylamide, N,N-dipropyl methacrylamide, N,N-diisopropyl methacrylamide, N,N-dibutyl methacrylamide, N,N-diisobutyl methacrylamide, N,N-di-tert-butyl methacrylamide, N,N-diheptyl methacrylamide, N,N-dioctyl methacrylamide, N,N-di-tert-octyl methacrylamide, N,N-didodecyl methacrylamide, N,N-dioctadecyl methacrylamide, N,N-dimethylol methacrylamide, N,N-diacetyl methacrylamide, N,N-didiacetone methacrylamide, N,N-methylethyl acrylamide, N,N-methylpropyl acrylamide, N,N-methylisopropyl acrylamide, N,N-ethylpropyl acrylamide, N,N-ethylisopropyl acrylamide, acrylpiperidine, acrylmorpholine, acrylthiomorpholine and acrylpyrrolidine. These can be used singularly or in combination of two or more kinds.

The polymer to be used as the additive is preferably one that has a skeleton of N-monosubstitution product of α-substitution of acrylamide or a skeleton of N,N-disubstitution product thereof. More preferably, the polymer has at least one of a skeleton of N-monosubstitution product of acrylamide, a skeleton of N-monosubstitution product of methacrylamide, a skeleton of N,N-disubstitution product of acrylamide and a skeleton of N,N-disubstitution product of methacrylamide. Further more preferably, a polymer of N,N-dimethyl acrylamide, that is, poly(N,N-dimethyl acrylamide) can be cited.

A slurry where the additive is added may be used as it is as the polishing slurry according to the invention. However, a pH stabilizer, a dispersing agent or a treatment agent of a surface to be polished may be appropriately added as needs arise. A method of adding these is also appropriately selected depending on a composition.

A carboxylate, phosphate, borate or amine salt can be used as the pH stabilizer of the polishing slurry. At least one of constituents having a pKa value within 1.0 unit of the pH of the polishing slurry can be preferably used as the pH stabilizer. For instance, when the pH of the polishing slurry is adjusted in the range of 5.0 to 6.0, preferable example includes: phosphoric acid, acetic acid, propionic acid, malonic acid, succinic acid, glutaric acid, adipic acid, maleic acid, fumaric acid, phthalic acid, citric acid and salts thereof, and ethylenediamine, pyridine, 2-aminopyridine, 3-aminopyridine, xanthosine, toluidine, picolinic acid, histidine, piperazine, 1-methylpiperazine, 2-bis(2-hydroxyethyl) amino-2-(hydroxymethyl)-1,3-propanediol, uric acid and salts thereof.

An amount of an additive added in the invention is preferably in the range of, relative to 100 parts by weight of the polishing slurry, 0.001 parts or more and 10 parts or less by weight. The range of 0.01 parts or more and 1 parts or less by weight is more preferable. When an amount of the additive added is too small, the high planarity characteristics is obtained with difficulty, and when it is added too much, the fluidity may be in some cases deteriorated owing to high viscosity.

Furthermore, a weight average molecular weight of the additive is preferably in the range of 500 to 5,000,000 and more preferably in the range of 1,000 to 1,000,000. When the molecular weight of the additive is less than 500, the high planarity characteristics can be obtained with difficulty, and when the molecular weight of the additive exceeds 5,000,000, the viscosity tends to become high, and the storage stability of the polishing slurry tends to deteriorate.

Furthermore, the polishing slurry according to the invention may contain other aqueous polymer. Examples include: polysaccharides such as alginic acid, pectic acid, carboxyl methyl cellulose, agar-agar, xanthan gum, chitosan, methyl glycol chitosan, methyl cellulose, ethyl cellulose, hydroxy propyl cellulose, hydroxy propyl methyl cellulose, hydroxy ethyl cellulose, curdlan and pullulan; polycarboxylic acids, salts thereof, esters thereof and derivatives thereof such as polyasparagic acid, polygultamic acid, polylysine, polymalic acid, polymethacrylic acid, ammonium polymethacrylate, sodium polymethacrylate, polymaleic acid, polyitaconic acid, polyfumaric acid, poly(p-styrene carboxylic acid), polyvinyl sulfate, polyacrylic acid, polyacrylamide, polyaminoacrylamide, ammonium polyacrylate, sodium polyacrylate, polyamide acid, ammonium polyamidate, sodium polyamidate and polyglyoxylic acid; polyethylene imine and salts thereof; vinyl base polymers such as polyvinyl alcohol, polyvinyl pyrrolidone and polyacrolein; polyethylene glycol, polypropylene glycol, polytetramethylene glycol, and ethylene glycol-propylene glycol block copolymer.

The specific surface area of particles of tetravalent metal hydroxide in thus prepared polishing slurry is preferably 100 $m^2/g$ or more and the average particle diameter of the secondary particles is preferably 300 nm or less. In the invention, particle diameters of particles in the polishing slurry are measured according to a photon correlation method (for instance, Model Coulter N4SD manufactured by Coulter). Furthermore, the specific surface area of the particles is measured by means of a BET method.

The particles are necessary to affect a chemical action on a film to be polished. When the specific surface area is less than 100 $m^2/g$, since a contact area with the film to be polished becomes smaller, the polishing speed tends to decrease. Furthermore, when the median value of the particle diameters of the secondary particles in the polishing slurry is larger than 300 nm, similarly, the contact area with the film to be polished becomes smaller and the polishing speed tends to decrease.

The pH of the polishing slurry is preferably 3 or more and 9 or less, more preferably 4 or more and 7 or less and particularly preferably 5 or more and 6 or less. When the pH is less than 3, the chemical action force becomes smaller. On the other hand, when the pH is more than 9, the diameters of the secondary particles become larger. In both cases, the polishing speed tends to decrease.

One selected from a group below can be preferably used as the medium other than water. That is, alcohols such as methanol, ethanol, 1-propanol, 2-propanol, 2-propyne-1-ol, allyl alcohol, ethylene cyanohydrin, 1-butanol, 2-butanol(S)-(+)-2-butanol, 2-methyl-1-propanol, tert-butyl alcohol, perfluoro-tert-butyl alcohol, tert-pentyl alcohol, 1,2-ethane diol, 1,2-propane diol, 1,3-propane diol, 1,3-butane diol, 2,3-butane diol, 1,5-pentane diol, 2-butene-1,4-diol, 2-methyl-2,4-pentane diol, glycerin, 2-ethyl-2-(hydroxymethyl)-1,3-propanediol, 1,2,6-hexane triol, ethylene glycol and diacetone alcohol;

ethers such as dioxane, trioxane, tetrahydrofuran, diethylene glycol diethyl ether, 2-methoxyethanol, 2-ethoxyethanol, 2,2-(dimethoxy)ethanol, 2-isopropoxyethanol, 2-butoxyethanol, 1-methoxy-2-propanaol, 1-ethoxy-2-propanol, furfuryl alcohol, tetrahydrofurfuryl alcohol, diethylene glycol, diethylene glycol monomethyl ether, diethylene glycol monoethyl ether, diethylene glycol monobutyl ether, triethylene glycol, triethylene glycol monomethyl ether, tetraethylene glycol, dipropylene glycol, dipropylene glycol monomethyl ether, dipropylene glycol monoethyl ether, tripropylene glycol monomethyl ether, polyethylene glycol, 2-methoxyethyl acetate, 2-ethoxyethyl acetate and diethylene glycol monoethyl ether acetate; and ketones such as acetone, methyl ethyl ketone, acetyl acetone and cyclohexanone can be cited. Among these, water, methanol, ethanol, 2-propanol, tetrahydrofuran, ethylene glycol, acetone and methyl ethyl ketone are preferable. Water is particularly preferable because it can give a higher polishing speed.

Furthermore, a quantity of the medium is not particularly restricted; however, it is preferable to be, relative to 100 parts by weight of particles, in the range of 1,000 to 1,000,000 parts by weight and more preferable to be in the range of 10,000 to 100,000 parts by weight.

A low pressure CVD method and a plasma CVD method can be cited as a method of preparing an inorganic insulating film that is polished when the polishing slurry and the polishing method according to the invention are applied.

When a silicon oxide insulating film is formed by use of the low pressure CVD method, monosilane:$SiH_4$ and oxygen:$O_2$ are used as a Si source and an oxygen source, respectively. The insulating film can be obtained when a $SiH_4$—$O_2$ oxidation reaction is carried out at such a low temperature as substantially 400° C. When phosphorus (P) is doped to planarize a surface owing to the high temperature reflow, a reaction gas of $SiH_4$—$O_2$—$PH_3$ system is preferably used.

The plasma CVD method has an advantage in that a chemical reaction that necessitates a high temperature under an ordinary thermal equilibrium can be carried out at lower temperatures. There are two methods of generating plasma, that is, a capacitance-coupled type and an induction-coupled type. A $SiH_4$—$N_2O$ gas that has $SiH_4$ as a Si source and $N_2O$ as an oxygen source and a TEOS—$O_2$ gas that uses tetraethoxy silane (TEOS) as a Si source (TEOS-plasma CVD method) can be cited as a reaction gas. A substrate temperature is preferably in the range of 250 to 400° C. and a reaction pressure is preferably in the range of 67 to 400 Pa. Thus, in the silicon oxide insulating film in the invention, elements such as phosphorus and boron may be doped.

Similarly, when a silicon nitride film is formed by use of the low pressure CVD method, as a Si source dichlorosilane ($SiH_2Cl_2$) is used and as a nitrogen source ammonia ($NH_3$) is used. When an oxidation reaction between $SiH_2Cl_2$ and $NH_3$ is carried out at such a high temperature as 900° C., the silicon nitride film can be obtained. In the plasma CVD method, a $SiH_4$—$NH_3$ gas where $SiH_4$ is used as a Si source and $NH_3$ is used as a nitrogen source can be cited. The substrate temperature is preferably in the range of 300 to 400° C.

In the polishing method according to the invention, a predetermined substrate is polished by use of the polishing slurry according to the invention.

A substrate in the course of manufacturing semiconductor devices can be preferably used as a substrate. Specifically, a semiconductor substrate where a silicon oxide film is formed thereon or a silicon oxide film and a silicon nitride film are formed thereon such as one in a stage where a circuit element and a wiring pattern are formed or a stage where a circuit element is formed can be used. When a silicon oxide film layer formed on such a semiconductor substrate is polished as a surface to be polished with the polishing slurry according to the invention, irregularities on the surface of the silicon oxide film layer can be eliminated, and thereby a scratchless smooth surface can be formed over an entire surface of the semiconductor substrate. In the case of the shallow trench isolation, while eliminating the irregularities of the silicon oxide film layer, the polishing is applied to a silicon nitride film layer in a lower layer, thereby to leave only a silicon oxide film deposited in an element isolation portion. At this time, when a ratio of the polishing speed of silicon oxide and that of silicon nitride as a stopper is large, a process margin in the polishing becomes larger. Here, when the above polymer is added to the polishing slurry as the additive, since the additive is selectively adsorbed to the silicon nitride film in a neutral pH region to work more effectively as a stopper film, the process can be more readily managed. Furthermore, in order to use in the shallow trench isolation, it is also important to generate less scratch during the polishing.

In what follows, a polishing method according to the invention will be described of a case where a substrate on which a silicon oxide film is formed is polished. However, the invention is not restricted to the above case.

In the beginning, a substrate on which at least a silicon oxide film is formed is prepared. A surface to be polished thereof is pressed against a polishing pad to apply pressure, and, while supplying the polishing slurry according to the invention between the polishing pad and the surface to be polished, the surface to be polished and the polishing pad are relatively moved to each other to polish the substrate.

As a polishing machine, a general-use polishing machine having a polishing table to which a polishing pad (polishing cloth) can be attached and a motor capable of varying the number of rotations is attached; and a holder supporting the substrate can be used.

Materials such as general nonwoven fabric, foamed polyurethane, and a porous fluorinated resin can be used as a polishing cloth. However, there is no restriction thereon. Furthermore, the polishing cloth is preferably grooved so as to pool the polishing slurry.

There is no particular restriction on the polishing conditions. However, in order to inhibit the substrate from flying off the polishing table, the polishing table is preferably rotated at such a low rotation as 100 rpm or less. The pressure at which the substrate having a surface to be polished is pressed against the polishing cloth is preferably in the range of 10 to 100 kPa (substantially 100 to 1000 $gf/cm^2$). In order to satisfy the uniformity of the polishing speed over a plane of the wafer and the planarity of the pattern, the pressure is more preferable to be in the range of 20 to 50 kPa (substantially 200 to 500 $gf/cm^2$). When the substrate is being polished, the polishing slurry is continuously supplied between the polishing cloth and the surface to be polished with such as a pump. There is no restriction on an amount of the polishing slurry supplied; however, a surface of the polishing cloth is preferable to be covered always with the polishing slurry.

As the relative motion, other than rotating the polishing table, a holder may be rotated or wobbled to polish. Furthermore, a polishing method where a polishing table is planetary-rotated and a method where a belt-like polishing pad is linearly moved in one direction along a long length direction can be cited. The holder may be in any one of states where it is fixed, rotated and wobbled. The polishing method, as far as it is one where the polishing pad and the surface to be polished of the substrate are relatively moved, can be appropriately selected depending on the surface to be polished and the polishing machine.

Furthermore, in order to polish with a surface state of the polishing pad always maintaining at the same condition, before polishing the substrate owing to the CMP, a conditioning process of the polishing pad is preferably added. For instance, a dresser to which diamond particles are adhered and a liquid containing at least water are used for conditioning. Subsequently, the polishing process according to the invention is carried out, and a substrate cleaning process including 1) brush cleaning to remove foreign matters such as particles adhered to the polished substrate,
2) megasonic cleaning to replace such as the polishing slurry with water, and
3) spin-drying for removing water from the surface of the substrate is preferably added.

By taking advantage of the polishing slurry according to the invention being capable of scratchlessly polishing a surface to be polished, it can be used also in the finish polishing. That is, after a first stage of the polishing is carried out with such as an ordinary silica slurry or a ceria slurry, the finish polishing is carried out with the polishing slurry according to the invention. Thereby, when the shallow trench isolation is applied, high-speed polishing can be applied while suppressing the generation of polishing scratches.

The polished semiconductor substrate, after thoroughly cleaning in flowing water, is preferably removed of water droplets adhered onto the semiconductor substrate by use of a spin dryer, followed by drying. Thus, after the shallow trench isolation is formed on a Si substrate, a silicon oxide insulating film layer and thereon an aluminum interconnection are formed, a silicon oxide film formed thereon is once more planarized according to a polishing method according to the invention. On the planarized silicon oxide film layer, aluminum interconnections as a secondary layer are formed, followed by forming a silicon oxide film between the interconnections and on the interconnections according to the above method, thereafter the polishing method according to the invention is applied to polish to eliminate the irregularities on a surface of the insulating film, thereby a smooth surface can be obtained over an entire surface of the semiconductor substrate. When the process is repeated predetermined times, a semiconductor having desired number of layers can be manufactured.

The polishing slurry according to the invention can be used to polish not only the silicon oxide film and the silicon nitride film formed on the semiconductor substrate, but also an inorganic insulating film formed on a printed circuit board having a predetermined interconnection such as a silicon oxide film, glass and silicon nitride; optical glass such as a photomask, a lens and a prism; a film of an inorganic conductor such as ITO; an optical integrated circuit, an optical switching element and an optical waveguide made of glass and a crystalline material; an end surface of optical fibers; optical single crystals such as a scintillator; solid laser single crystal; LED sapphire substrate for blue laser; semiconductor single crystals such as SiC, GaP and GaAs; a glass substrate for magnetic disc; and a magnetic head.

EXAMPLES

In what follows, the invention will be more detailed with reference to examples.

Example 1

Preparation of Polishing Slurry

Into pure water of 7300 g, 430 g of $Ce(NH_4)_2(NO_3)_6$ is dissolved, followed by mixing 240 g of aqueous ammonia (25% aqueous solution) to the solution and agitating, and thereby 160 g of cerium hydroxide (yellowish white) is obtained. The obtained cerium hydroxide is liquid-solid separated according to centrifugation (4000 rpm and for 5 min.).

The liquid is removed, pure water is added anew, and the centrifugation is again applied under the above conditions. Such a procedure is repeated four times to wash. The specific surface area of the obtained particles is measured according to the BET method and found to be 200 m$^2$/g.

Into a two-liter flask, 300 g of deionized water is fed, followed by heating to 80° C. while stirring under a nitrogen gas atmosphere, further followed by injecting one in which 1.5 g of a polymerizing initiator (trade name: V-501 manufactured by Wako Pure Chemical Industries, Ltd.) is dissolved in 100 g of N,N-dimethyl acrylamide over 1 hr. Thereafter, after keeping for 5 hr at 80° C., followed by cooling and taking out, and thereby a 25% aqueous solution of poly(N,N-dimethyl acrylamide) is obtained. With a GPC system (Model No. LC-6A manufactured by Shimadzu Corporation) provided with 0.3M NaCl water as an eluent, model W-550 manufactured by Hitachi Chemical Co., Ltd. as a column and a differential refractometer, a molecular weight of the poly (N,N-dimethyl acrylamide) is measured and found to be 250,000 (in terms of polyethylene glycol) as the weight average molecular weight.

Four grams of cerium hydroxide obtained according to the above method, 8 g of an aqueous solution of poly(N,N-dimethyl acrylamide) (weight average molecular weight: 250,000, 25% aqueous solution) and 1988 g of pure water are mixed and the pH thereof is controlled to 4.2 with aqueous ammonia. Thereafter, ultra-sonic dispersion is applied, further followed by filtering with a 1 μm membrane filter, and thereby a cerium hydroxide polishing slurry is obtained. A secondary particle diameter of particles in the polishing slurry is measured with a photon correlation method and the median value thereof is found to be 170 nm.

(Polishing of Insulating Film Layer)

Figure 1A:
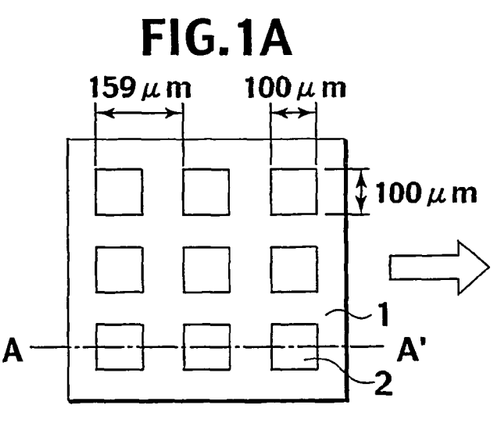
FIG. 1A is a plan view after a trench is formed.
Figure 1B:
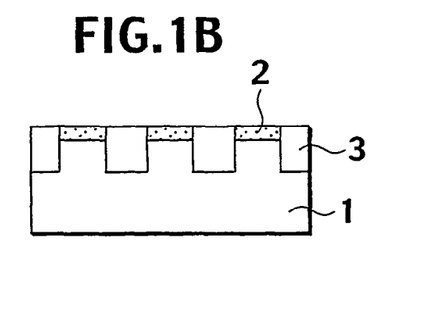
FIG. 1B is a vertical sectional view along an AA' plane in FIG. 1A.
Figure 1C:
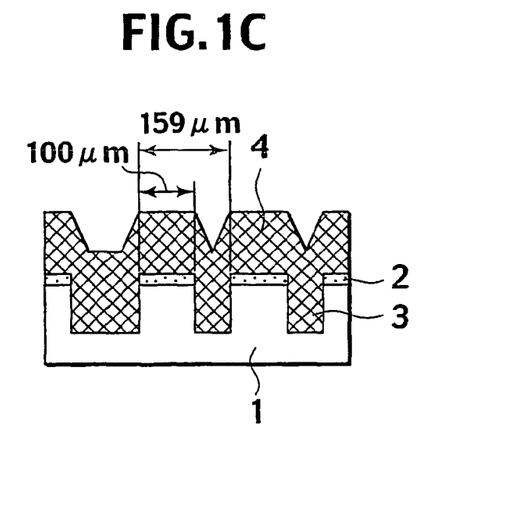
FIG. 1C is a vertical sectional view after an insulating layer is deposited.

In FIGS. 1A through 1C, schematic diagrams of an evaluation wafer used in the example according to the invention are shown. That is, as shown in a plan view of FIG. 1A and a vertical sectional view of FIG. 1B, on a silicon (Si) substrate 1 having a diameter of 200 mm, a 100 nm thick silicon nitride (SiN) film 2 is deposited, followed by further forming trenches 3. In the next place, as shown in a vertical sectional view in FIG. 1C, the trenches 3 are deposited with a silicon oxide (SiO$_2$) insulating film 4, and thereby a CMP evaluation test wafer for shallow trench isolation (STI) insulating film is prepared.

An initial film thickness of the insulating film 4 is 610 nm at active regions and 650 nm at trench regions. A depth of the trench 3 is 460 nm. Furthermore, a distance between a portion of 100 μm square silicon nitride film and an adjacent portion thereof is set at 59 μm.

The above-mentioned evaluation test wafer is set to a holder to which an adsorption pad for attaching a supporting substrate is adhered, of a polishing machine Model EPO-111 manufactured by Ebara Corporation, on the other hand, to a polishing table having a diameter of 600 mm of the machine a polishing pad IC-1000 (perforate) made of a porous polyurethane resin (manufactured by Rodel Inc.) is adhered. On the polishing pad, the holder is placed with an insulating film 4 surface directed downward, followed by setting working load at 30 kPa. While pouring the above-prepared cerium hydroxide polishing slurry at a speed of 200 mL/min on the polishing table, the polishing table and the wafer are respectively rotated at 50 rpm to polish the CMP evaluation test wafers for STI insulating film for 3, 4, 5, 6, 7 and 9 min. The polished wafers are thoroughly cleaned with pure water followed by drying.

Thereafter, with an optical interference thickness meter (Trade name: Nanospec AFT-5100 manufactured by Nanometrix Inc.), film thickness of the insulating film 4 remaining on the trench regions, film thickness of the insulating film remaining on the active regions and film thickness of the remaining SiN film 2 are measured. Measurement results of the remaining film thicknesses with time are shown with graphs in FIGS. 2 and 3. Furthermore, FIG. 1C is partially enlarged and shown side by side to associate the respective film thicknesses before polishing with the graph. Still further, with a profilometer (Trade name: Dektak V-200-Si manufactured by ULVAC, Inc.), a step remaining between the active regions and the trench regions after the polishing is measured.

Figure 2:
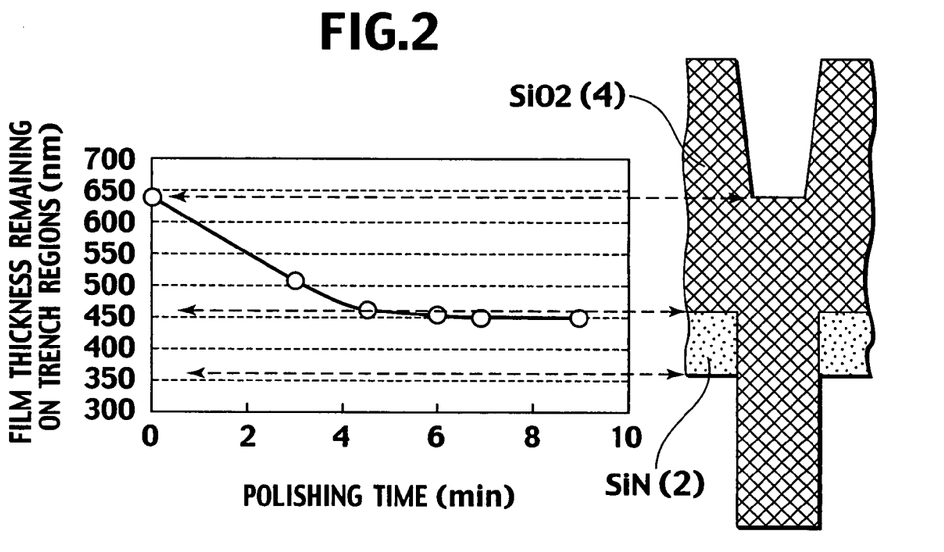
FIG. 2 includes a graph showing relationship between amount of insulating film remaining on trench regions and a polishing time in an example according to the invention, and a partially enlarged diagram of FIG. 1C showing respective film thicknesses before polishing.

As a result thereof, as shown in FIG. 2, it is found that, in the trench regions, after 6 min, the remaining film thicknesses hardly show variation, that is, the polishing is hardly forwarded.

Figure 3:
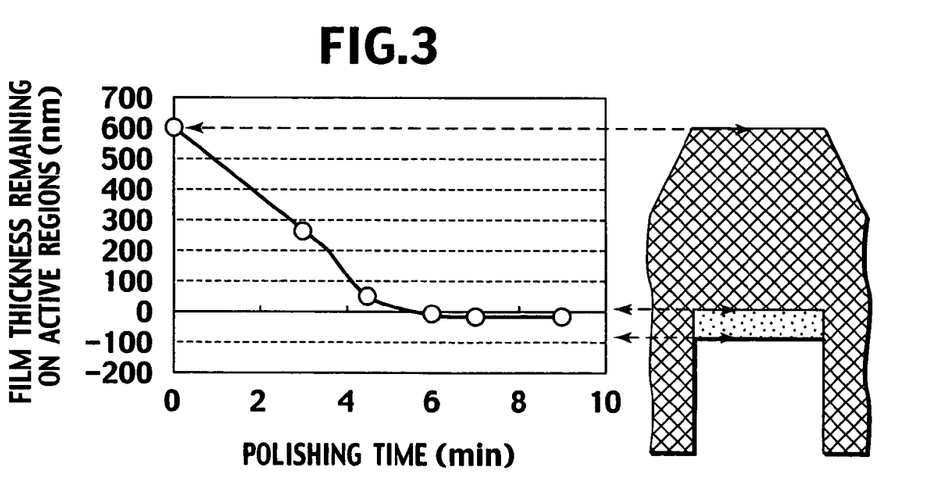
FIG. 3 includes a graph showing relationship between amount of insulating film remaining on active regions and a polishing time in an example according to the invention, and a partially enlarged diagram of FIG. 1C showing respective film thicknesses before polishing.

Furthermore, as shown in FIG. 3, at the active regions, at 6 min, the insulating film is completely polished and the SiN film is exposed. It is found that, after 6 min, the film thickness of the remaining SiN film does not vary, that is, the polishing is hardly forwarded. It is also found that even when the polishing is excessively applied for more than 6 min the irregularities are not excessive polished.

Furthermore, it is found that a remaining step at 6 min polishing is 2 nm and even when the polishing is further applied by one minute the remaining step is 10 nm, that is, high planarity is achieved.

When the surface of the insulating film is observed with an optical microscope, there is found no distinct polishing scratch.

Example 2

Polishing of Insulating Film Layer

In advance of polishing the CMP evaluation test wafers for STI insulating film by use of the polishing slurry prepared according to the example 1, with a cerium oxide polishing slurry (a mixture of trade names HS-8005/HS-8102GP at a mixing ratio of 1/2) (manufactured by Hitachi Chemical Co., Ltd.), under the same polishing conditions as that of example 1, the CMP evaluation test wafers for STI insulating film are polished for 50 and 100 sec. Subsequently, the polishing slurry is replaced with the polishing slurry prepared according to example 1, and the CMP evaluation test wafers for STI insulating film are further polished for 50, 100 and 150 sec, respectively. Thereafter, according to a method similar to that of example 1, evaluations are carried out.

Figure 4:
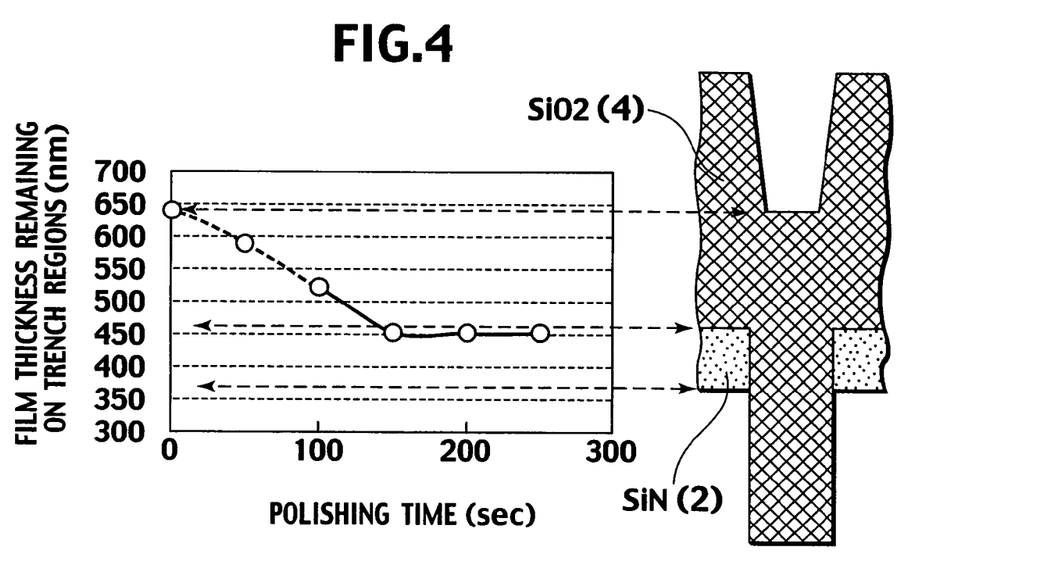
FIG. 4 includes a graph showing relationship between amount of insulating film remaining on trench regions and a polishing time in an example according to the invention, and a partially enlarged diagram of FIG. 1C showing respective film thicknesses before polishing.

As shown in FIG. 4, it is found that according to the polishing with the cerium oxide polishing slurry for 100 sec the remaining film thickness on the trench regions rapidly decreases (a dashed line portion in the drawing), and, after a total polishing time of 150 sec (a solid line portion in the drawing) where finish polishing is applied with the polishing slurry according to the invention, the remaining film thickness does not vary, that is, the polishing is hardly forwarded.

Figure 5:
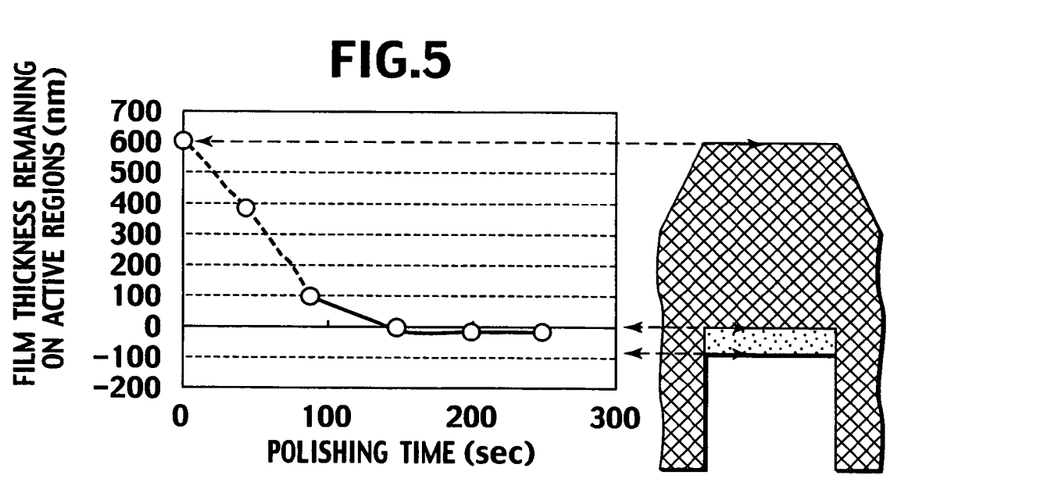
FIG. 5 includes a graph showing relationship between amount of insulating film remaining on active regions and a polishing time in an example according to the invention, and a partially enlarged diagram of FIG. 1C showing respective film thicknesses before polishing.

Furthermore, at the active regions, as shown in FIG. 5, owing to the polishing for 100 sec (a dashed line portion in the drawing) with the cerium oxide polishing slurry, the film thickness of the remaining SiO$_2$ film is substantially 100 nm. After 150 sec (a solid line portion in the drawing) where the finish polishing is applied with the polishing slurry according to the invention, the insulating film is completely polished and the SiN film is exposed. It is found that, after a total polishing time of 150 sec, the film thickness of the remaining SiN film does not show variation, that is, the polishing is hardly forwarded. It is found that even when the polishing is excessively applied for more than 150 sec, the irregularities are not excessively polished.

The remaining step after the total polishing time of 150 sec is 3 nm and it is found that high planarity is achieved.

When the surface of the insulating film is observed with an optical microscope, there is found no distinct polishing scratch.

Comparative Example

Two kilograms of cerium carbonate hydrate are sintered at 400° C. to obtain cerium oxide. Cerium oxide and pure water are mixed followed by pulverizing and dispersing with a bead mill. After filtering with a 1 μm membrane filter, a cerium oxide polishing slurry is obtained. The specific surface area of particles is 150 m²/g and the median value of secondary particles is 200 nm.

Except that the cerium oxide polishing slurry prepared according to the above is used, similarly to example 1, CMP evaluation test wafers for shallow trench isolation (STI) insulating film are polished. As a result thereof, it is found that when the polishing is applied for more than 3 min an insulating film on the trench regions and a SiN film on the active regions are all polished.

INDUSTRIAL APPLICABILITY

As mentioned above, according to the invention, a polishing slurry for CMP excellent in the dispersing properties of tetravalent metal hydroxide particles and a polishing method that can impart global planarity when an irregular substrate is polished can be obtained. Furthermore, a manufacturing method of a semiconductor device, which can polish a surface to be polished such as a SiO₂ insulating film at a high-speed without causing the polishing scratches and which is excellent in the working precision of a surface to be polished can be provided.

The invention claimed is:

1. A polishing slurry for polishing an inorganic insulating film containing a slurry in which particles are dispersed in a medium and an additive, wherein the particles consist of cerium hydroxide, the pH of the polishing slurry is from 3 to 9 and the additive is a polymer containing at least one kind of monomer component selected from the group consisting of monomers represented by general formula (I) below (I)

wherein in the general formula (I), $R_1$ denotes hydrogen, a methyl group, a phenyl group, a benzil group, a chlorine group, a difluoromethyl group, a trifluoromethyl group or a cyano group, and, $R_2$ and $R_3$, respectively, independently denote hydrogen or an alkyl chain having 1 to 18 carbon atoms, a methylol group, an acetyl group or a diacetonyl group, and a case where both are hydrogen is not included) and a general formula (II) below (II)

wherein in the general formula (II), $R_1$ is common with the formula (I) and $R_4$ denotes a morpholino group, a thiomorpholino group, a pyrrolidinyl group or a piperidino group) wherein the polishing slurry is capable of polishing an inorganic insulating film.

2. The polishing slurry according to claim 1, wherein a specific surface area of the particles consisting of cerium hydroxide is not less than 100 m²/g.

3. The polishing slurry according to claim 1, wherein a median value of particle diameters of secondary particles of the particles consisting of cerium hydroxide dispersed in a medium is not more than 300 nm.

4. The polishing slurry according to any one of claims 1, 2 and 3, wherein the polymer has at least one of a skeleton of an N-mono-substitution product of acrylamide, a skeleton of an N-mono-substitution product of methacrylamide, a skeleton of an N,N-disubstitution product of acrylamide or a skeleton of an N,N-disubstitution product of methacrylamide.

5. The polishing slurry according to claim 1, wherein the additive is a polymer consisting of at least one kind of monomer component selected from the group consisting of monomers represented by general formula (I) below (I)

wherein in the general formula (I), $R_1$ denotes hydrogen, a methyl group, a phenyl group, a benzil group, a chlorine group, a difluoromethyl group, a trifluoromethyl group or a cyano group, and, $R_2$ and $R_3$, respectively, independently denote hydrogen or an alkyl chain having 1 to 18 carbon atoms, a methylol group, an acetyl group or a diacetonyl group, and a case where both are hydrogen is not included) and a general formula (II) below (II)

wherein in the general formula (II), $R_1$ is common with the formula (I) and $R_4$ denotes a morpholino group, a thiomorpholino group, a pyrrolidinyl group or a piperidino group).

6. The polishing slurry according to claim 5, wherein the polymer is poly(N,N-dimethyl acrylamide).

7. The polishing slurry according to claim 1, wherein the tetravalent metal hydroxide is obtained by blending a tetravalent metal salt and an alkaline liquid.

8. The polishing slurry according to claim 1, wherein the medium is water.

9. A polishing method characterized in that a predetermined substrate is polished with the polishing slurry according to claim 1.

10. The polishing slurry according to claim 1, wherein the polishing slurry has a property that a ratio of a polishing speed of a silicon oxide insulating film to that of a silicon nitride insulating film is 10 or more.

11. The polishing slurry according to claim 1, wherein the additive increases a ratio of a polishing speed of a silicon oxide insulating film to that of a silicon nitride insulating film over said ratio in said polishing slurry but without said additive.

12. A polishing method characterized in that a surface to be polished of a substrate on which at least a silicon oxide film is formed is pressed against a polishing pad to apply pressure, and, with the polishing slurry described in claim 1 supplied between the polishing pad and the surface to be polished, the surface to be polished and the polishing pad are relatively moved to each other to polish.

13. The polishing method according to claim 12, wherein the substrate is a substrate in the process of manufacturing a semiconductor device.

14. The polishing method according to claim 12, wherein said substrate comprises a silicon nitride film and a ratio of a polishing speed of the silicon oxide film to that of the silicon nitride film is 10 or more.

15. The polishing method according to claim 12, wherein said substrate comprises a silicon nitride film and wherein the additive increases a ratio of a polishing speed of the silicon oxide film to that of the silicon nitride film over said ratio in said polishing slurry but without said additive.

* * * * *